United States Patent [19]

Telford et al.

[11] Patent Number: 5,997,950
[45] Date of Patent: Dec. 7, 1999

[54] SUBSTRATE HAVING UNIFORM TUNGSTEN SILICIDE FILM AND METHOD OF MANUFACTURE

[75] Inventors: Susan G. Telford, Untergruppenbach, Germany; Meng Chu Tseng, Saratoga, Calif.; Michio Aruga, Inba-gun, Japan; Klaus-Dieter Rinnen, Palo Alto, Calif.

[73] Assignee: Applied Materials, Inc., Santa Clara, Calif.

[21] Appl. No.: 08/863,676

[22] Filed: May 27, 1997

Related U.S. Application Data

[63] Continuation of application No. 08/480,652, Jun. 7, 1995, abandoned, which is a continuation-in-part of application No. 08/064,328, May 18, 1993, Pat. No. 5,500,249, which is a continuation-in-part of application No. 07/995,211, Dec. 22, 1992, abandoned.

[51] Int. Cl.[6] .................................................. C23C 16/42
[52] U.S. Cl. .................................... 427/255.392; 438/683
[58] Field of Search ...................... 427/255.392; 438/683

[56] References Cited

U.S. PATENT DOCUMENTS

| | | | |
|---|---|---|---|
| 4,180,596 | 12/1979 | Crowder et al. | 427/42 |
| 4,391,846 | 7/1983 | Raymond | 427/99 |
| 4,629,635 | 12/1986 | Brors | 427/255.2 |
| 5,183,782 | 2/1993 | Onishi et al. | 437/192 |
| 5,231,056 | 7/1993 | Sandhu | 437/200 |
| 5,326,723 | 7/1994 | Petro et al. | 437/192 |
| 5,500,249 | 3/1996 | Telford et al. | 427/255 |

FOREIGN PATENT DOCUMENTS 7-100860  11/1995  Japan .

OTHER PUBLICATIONS

Wu et al. "Properties using dichlorosilane in a single-wafer system", J. Vac. Sci. Technol. B6(6), Nov./Dec. 1988.

*Primary Examiner*—Shrive Beck
*Assistant Examiner*—Bret Chen
*Attorney, Agent, or Firm*—Janah & Associates

[57] ABSTRACT

A tungsten silicide film is deposited on a substrate from a premixed deposition gas mixture comprising: (i) silicon source gas, such as $SiCl_2H_2$ and (ii) tungsten source gas, such as $WF_6$. A seeding gas, such as silane, is used during the initial deposition stages to deposit a substantially uniform interfacial $WSi_x$ layer on the substrate, so that the tungsten to silicon ratio of the $WSi_x$ layer is substantially uniform through the thickness of the $WSi_x$ film. An apparatus for performing the process is also described.

47 Claims, 9 Drawing Sheets

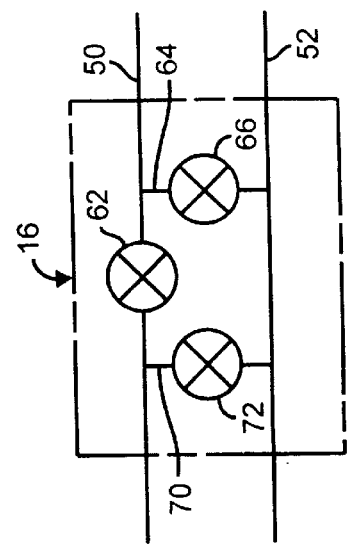
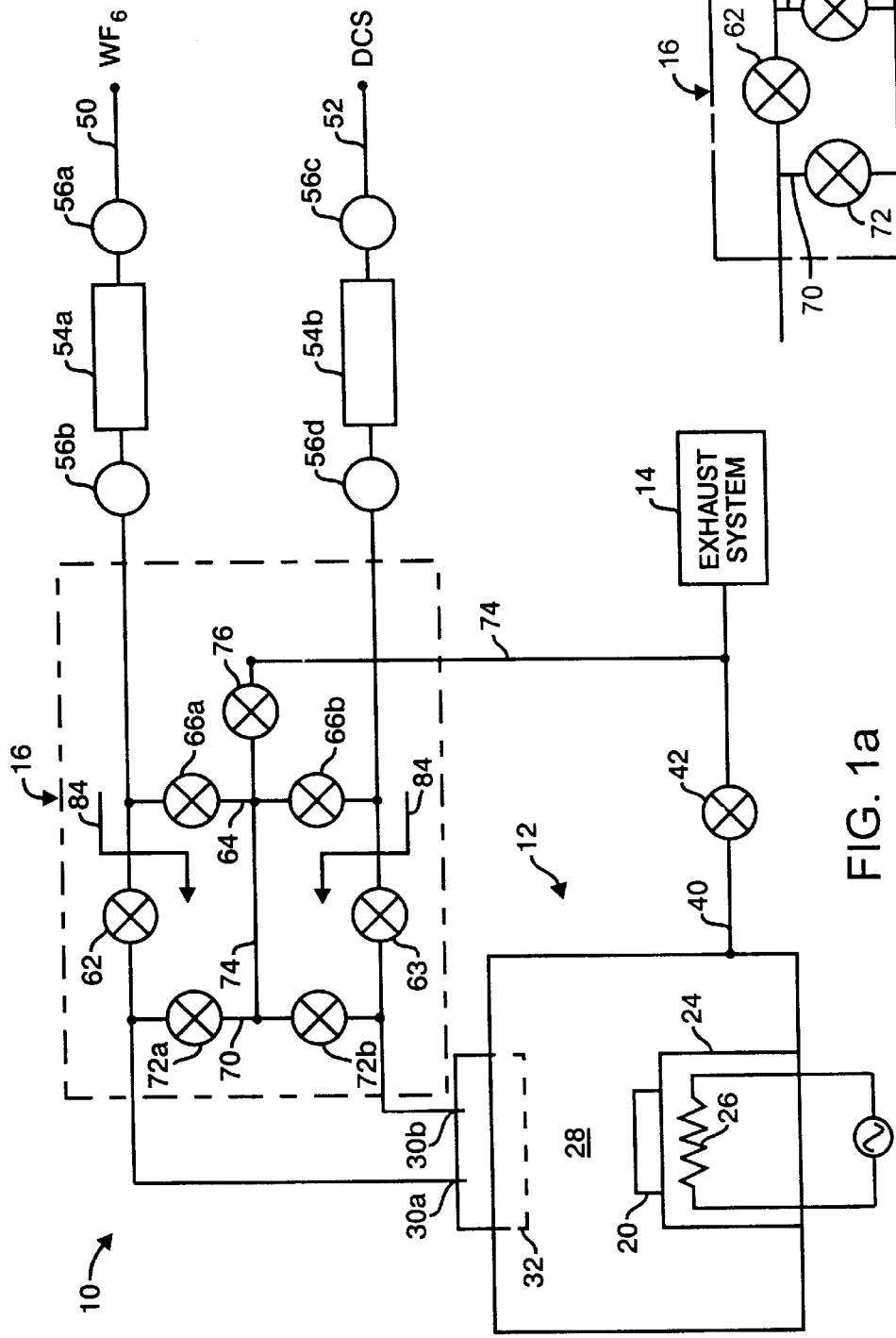
FIG. 1b
FIG. 1a

SUBSTRATE HAVING UNIFORM TUNGSTEN SILICIDE FILM AND METHOD OF MANUFACTURE

CROSS-REFERENCE

This is a continuation of application Ser. No. 08/480,652, filed on Jun. 7, 1995, now abandoned, which is a Continuation-in-part of U.S. patent application Ser. No. 08/064,328, filed May 18, 1991, now U.S. Pat. No. 5,500,249; which is a Continuation-in-Part of U.S. patent application Ser. No. 07/995,211, filed on Dec. 22, 1992, now abn., and a Continuation-in-Part of Japanese Patent Application Serial No. 5-76894, filed on Apr. 2, 1993.

BACKGROUND

This invention relates to the deposition of tungsten-silicide ($WSi_x$) films.

Refractory metal silicide films, such as tungsten silicide, are used in the manufacture of semiconductor integrated circuits such as schottky barriers, ohmic contacts and gate metallizations. Traditionally, polysilicon layers were used for these semiconductor circuits. However, advances in integrated circuit technology led to a scaling down of device dimensions, and an increase in chip size and complexity. Higher complexity chips such as VLSI's (very large-scale integrated circuits), require closely spaced inter-connection lines with smaller cross-sectional areas than conventional integrated circuits. The small cross-sectional area of the interconnection lines results in generation of more resistive heat. Close spacing results in less heat dissipation. This combination of more resistive heat generation and less heat dissipation can cause high temperatures which can result in part failure. Also, the higher resistivity increases the RC time constant which affects the delay time of the circuit. Low delay times are desirable for high speed circuits.

To overcome this problem, refractory metal silicides films having lower resistivities than polysilicon films were developed for use in these improved integrated circuits to obtain lower delay times and so that less heat is generated within the circuit. For gate metallizations, a low resistivity tungsten silicide film is deposited on top of a layer of polycrystalline silicon (polysilicon), to form a layered structure called a "polycide" structure.

At first, tungsten silicide films were deposited by physical vapor deposition techniques such as sputtering and electron-beam evaporation. However, these techniques gave films with poor conformal coverage over the steps and trenches of the polysilicon layer and non-uniform stoichiometry. Alternative deposition techniques such as low pressure chemical vapor deposition (LPCVD) were developed, and provided metallic silicide films with superior conformal coverage and superior properties.

Initially LPCVD processes for the deposition of tungsten silicide ($Wsi_x$) films were based on the reduction of tungsten hexa-fluoride ($WF_6$) by monosilane ($SiH_4$). However, $WSi_x$ films produced using monosilane contained high levels of fluorine (often greater than $10^{20}$ fluorine atoms/cc). The high levels of fluorine led to degradation of these films due to migration of the fluorine atoms at operating temperatures. In addition, these films suffered from lower step-coverage and post-annealing problems which can lead to cracking and delamination of the tungsten-silicide layer.

Problems created by the silane chemistry can be avoided by using dichlorosilane (DCS), $SiH_2Cl_2$, instead of monosilane. Tungsten-silicide films produced from the reduction of $WF_6$ by DCS exhibit lower fluorine content, improved step coverage and stronger adhesion.

However, in spite of these encouraging results, the DCS/$WF_6$ process has not been extensively adopted by the semiconductor industry because there are additional problems with these technologies.

First, these processes can fail to produce $WSi_x$ films with a uniform tungsten to silicon ratio through the thickness of the film. In the strata deposited in the initial stages of deposition (which later becomes the "interfacial layer" between the $WSi_x$ film being deposited and the substrate), the films deposited from current methods generally exhibit a value of "x" that is below the optimal range of 2.0 to 2.8. This phenomena is especially true for $WSi_x$ layers deposited on polysilicon. Values of x smaller than 2 (x=2 corresponds to the stoichiometry of the stable tungsten silicide, $WSi_2$) in this interfacial strata are undesirable. The formation of an interfacial tungsten-rich strata can result in delamination of the $WSi_x$ layer during annealing of the fully processed wafer in the final stages of processing. Voids created by the migration of Si ions from the Si rich polysilicon layer to the Si deficient $WSi_x$ layer can also lead to poorer performance.

It is difficult to non-destructively detect formation of the tungsten-rich layer during the initial steps in the process of fabricating the integrated circuit chip. It is only in the final stages of the manufacturing process, when the fully processed wafers are worth between $50,000 to $100,000 each, that the delamination is discovered, and the entire wafer must be scrapped. This expense limits the use of current DCS/$WF_6$ processes on an industrial scale.

Another problem with conventional CVD processes is that it is difficult to deposit a tungsten silicide film having a uniform sheet resistance. Typically, as a silicon content of the film is increased, the tungsten silicide film has a higher sheet resistance, and a greater non-uniformity in sheet resistance. Conventional tungsten silicide films have sheet resistances from about 500 to about 1500 $\mu\Omega$-cm, and more typically from about 600 to about 1200 $\mu\Omega$-cm. As the composition of the film is tailored to produce the higher sheet resistance, namely above 1000 $\mu\Omega$-cm, the non-uniformity of the sheet resistance of the film also increases. Conventional CVD methods typically deposit $WSi_x$ films having sheet resistances with non-uniformities of about 1.5 to about 2.5%.

Another problem associated with use of current DCS/$WF_6$ processes arises from the nucleation of silicon containing particles in the dichlorosilane gas phase. These particles accumulate and deposit on the walls of the deposition chamber. These deposits eventually fragment and generate particles which contaminate the wafer.

LPCVD equipment is typically sophisticated and expensive. Thus, new processes requiring substantial modification to existing equipment are avoided due to the high costs associated with such modifications. Accordingly, processes that can be implemented on conventional CVD equipment are highly desirable.

Therefore, there is a need for $WSi_x$ films having substantially uniform tungsten to silicon ratios through the thickness of the film and having low concentrations of fluorine. There is also a need for methods to deposit such films, and it is also desirable to be able to use conventional CVD equipment to deposit such films. There is also a need for a CVD process capable of depositing $WSi_x$ films having uniform sheet resistance, particularly at higher sheet resistivities.

SUMMARY

The present invention provides a $WSi_x$ film and methods for their manufacture that satisfy the above needs. The $WSi_x$ films prepared in accordance with the present invention have a high degree of uniformity through the thickness of the film, a low concentration of fluorine and other impurities within the film, and can be deposited using conventional CVD equipment.

The present invention is directed to a $WSi_x$ layer on a substrate, where the value of x in the layer is substantially uniform through the thickness of the $WSi_x$ layer, and the $WSi_x$ layer contains less than $10^{18}$ fluorine atoms/cc, and more preferably less than $10^{17}$ fluorine atoms/cc. The layer of $WSi_x$ is at least 300Å thick. By "substantially uniform" it is meant that the average value of x within each strata of the $WSi_x$ layer is between ±10% of the average bulk value of x through the thickness of the $WSi_x$ layer. Typically, the bulk value of x is from about 2.0 to about 2.8, and preferably the value of x is from about 2.2 to about 2.6. The $WSi_x$ layer can be deposited on top of a layer of polycrystalline silicon, an $SiO_2$ layer, or directly on top of a semiconductor wafer, such as a silicon or gallium arsenide wafer.

The $WSi_x$ film is deposited using chemical vapor deposition (CVD) processes. In a preferred two-stage CVD process, a substrate is placed in a deposition chamber having first and second gas inlets. A mixed deposition gas is formed by combining a silicon source gas and a tungsten source gas sufficiently upstream of the deposition chamber that the mixed deposition gas is substantially uniformly mixed prior to introduction into the deposition chamber.

During an initial deposition stage of the process, the mixed deposition gas is introduced into the deposition chamber through the first gas inlet. Separately, a seeding gas is introduced into the deposition chamber through the second gas inlet. The deposition chamber is maintained at process conditions suitable for depositing a $WSi_x$ interfacial layer with a uniform Si:W ratio on the substrate.

During a second deposition stage of the process, the flow of seeding gas is stopped while continuing to introduce dichlorosilane and tungsten hexafluoride into the deposition chamber. The deposition chamber is maintained at process conditions suitable for depositing a substantially uniform, substantially fluorine-free, $WSi_x$ layer on the substrate.

Preferably, the silicon source gas and the tungsten source gas are combined at least 2.5 inches upstream of the deposition chamber. More preferably, the silicon source gas and the tungsten source gas are selected so that there is substantially no gas phase nucleation of the gases when the gases are mixed.

DRAWINGS

These and other feature, aspects, and advantages of the present invention will become better understood with reference to the following description, appended claims, and accompanying drawings where:

FIG. 1a is a schematic view of a chemical vapor deposition apparatus suitable for preparing the $WSi_x$ films of the present invention;

FIG. 1b is a schematic view of another version of the mixing assembly of FIG. 1a;

Figure 2:
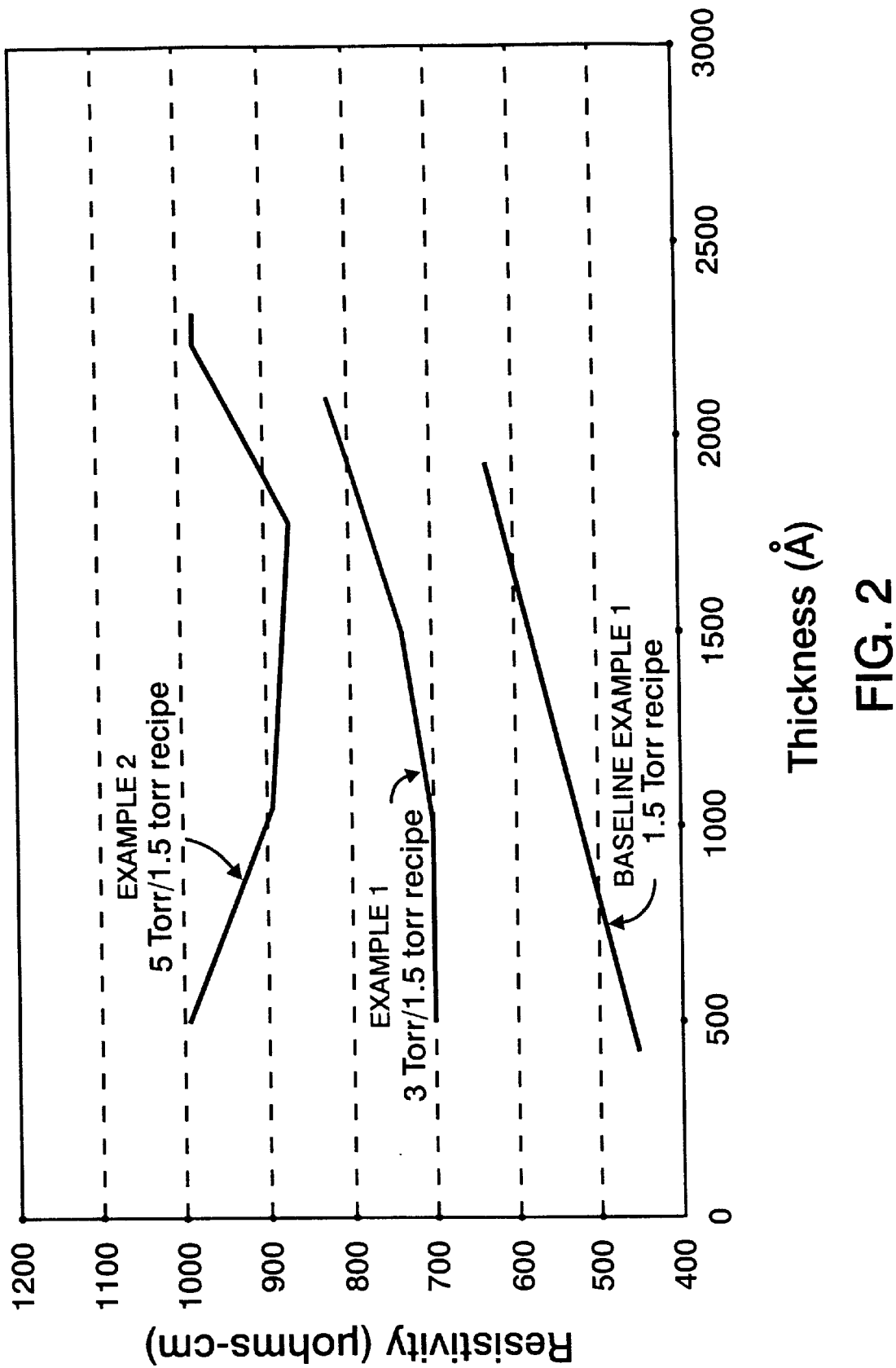
Figure 3:
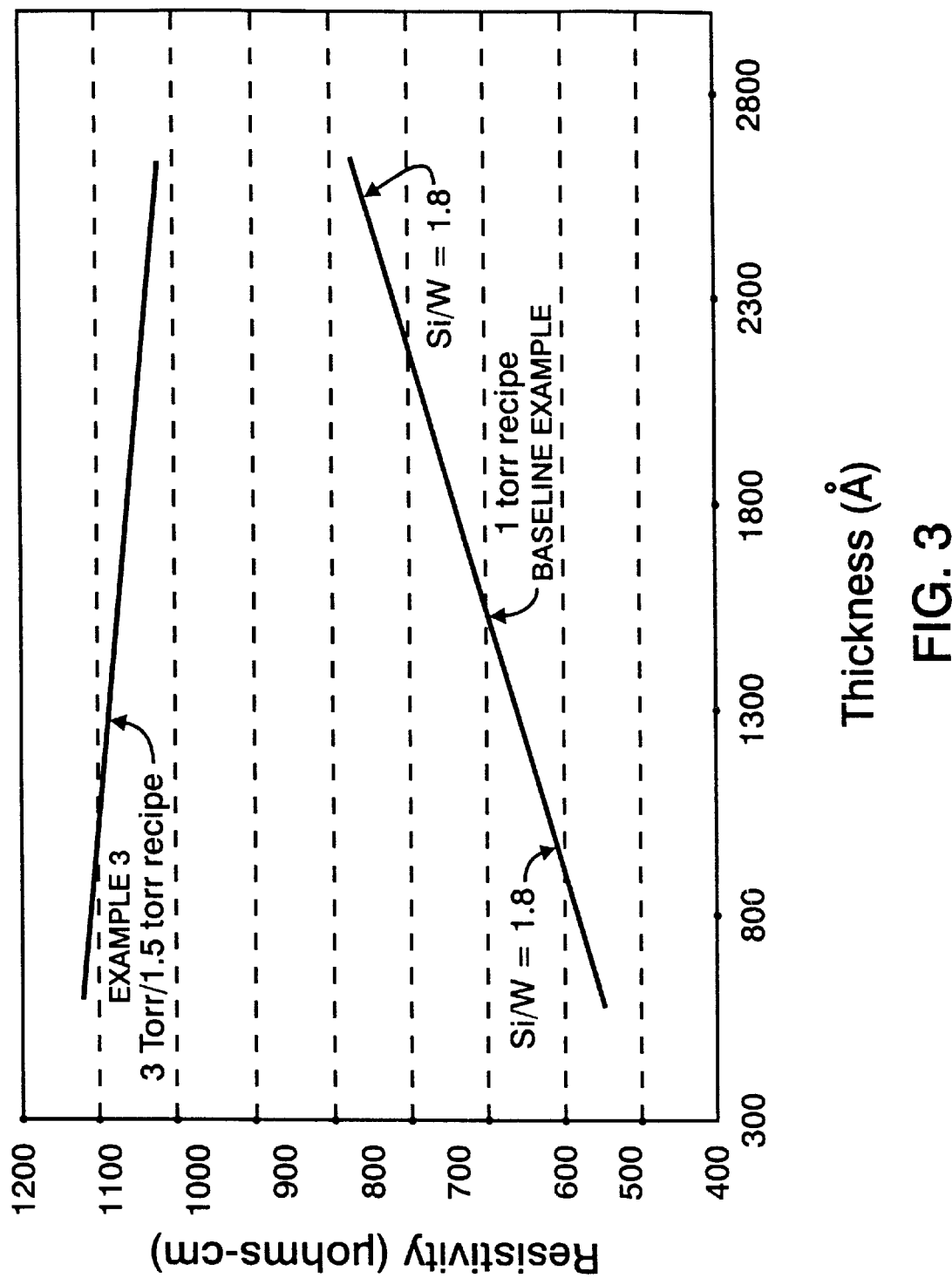
Figure 4:
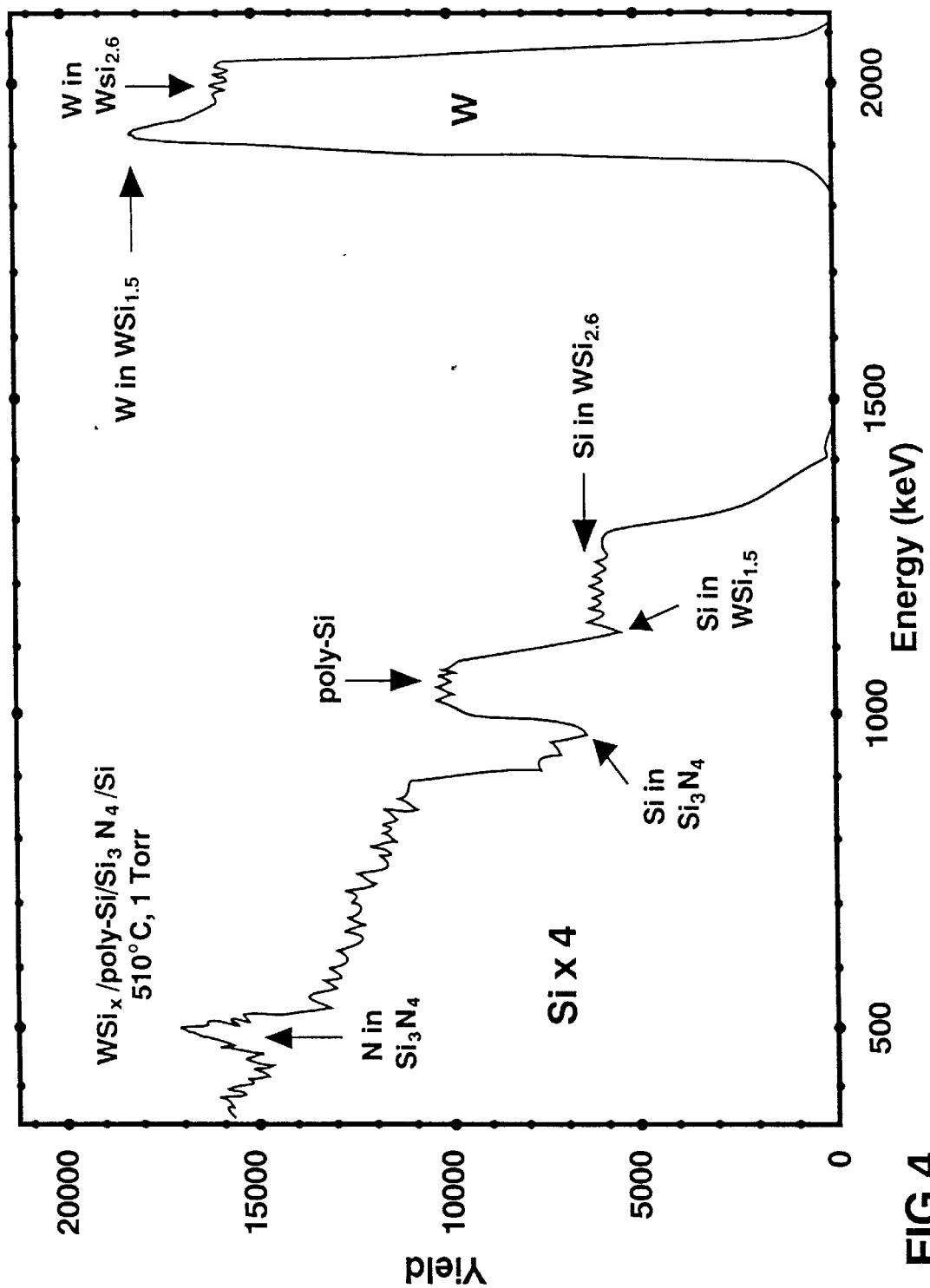
Figure 5:
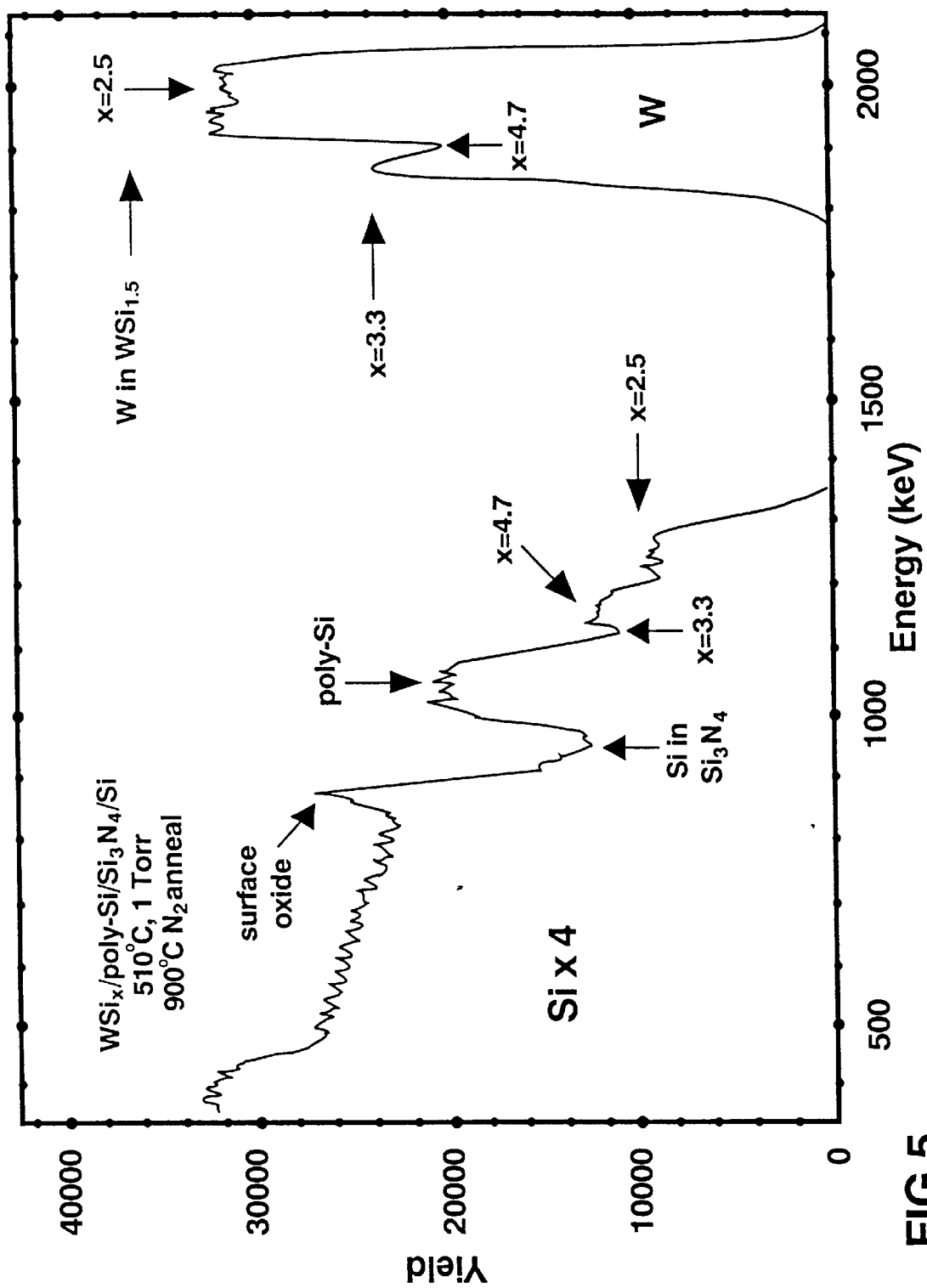
Figure 6:
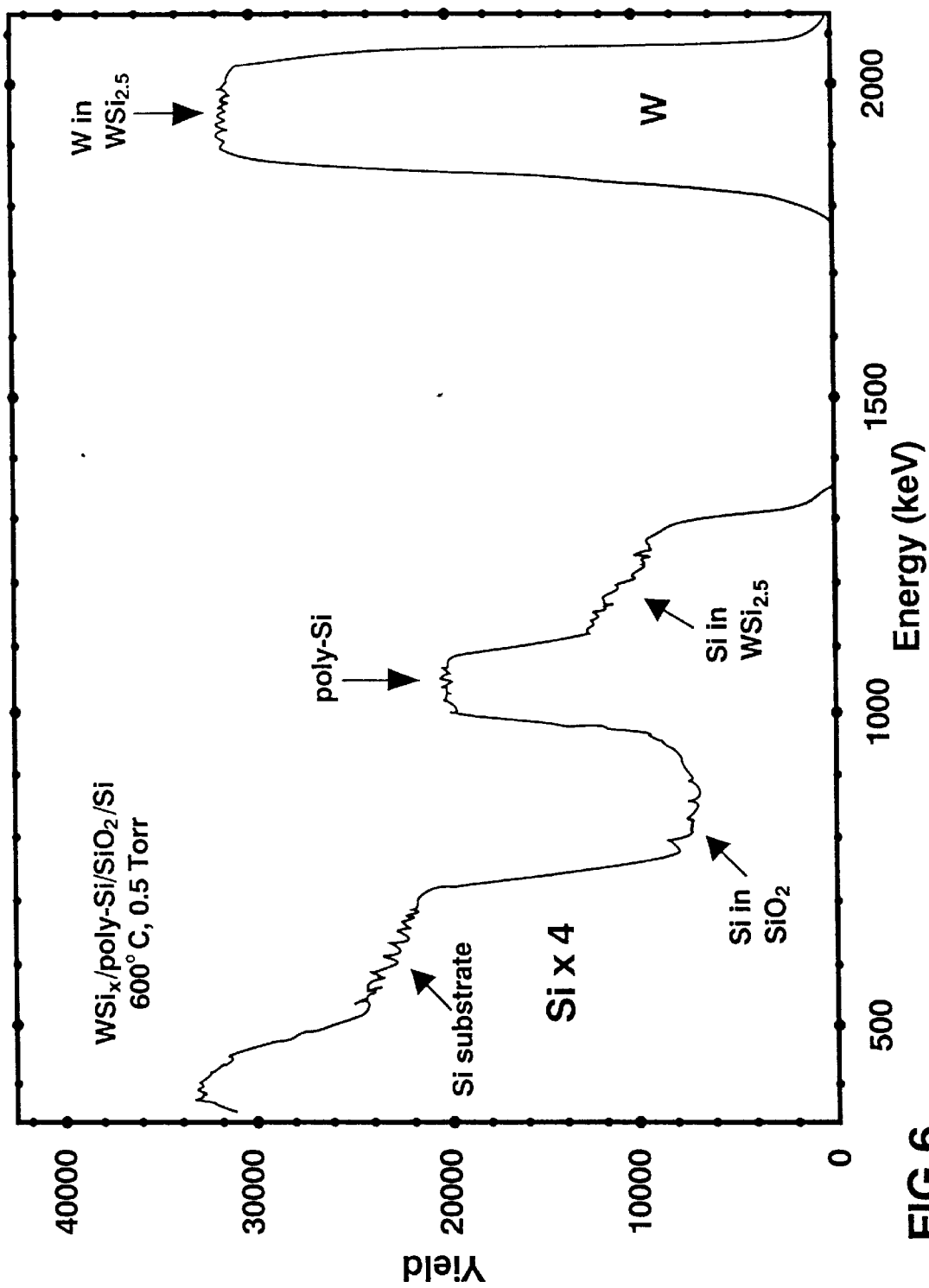
Figure 7:
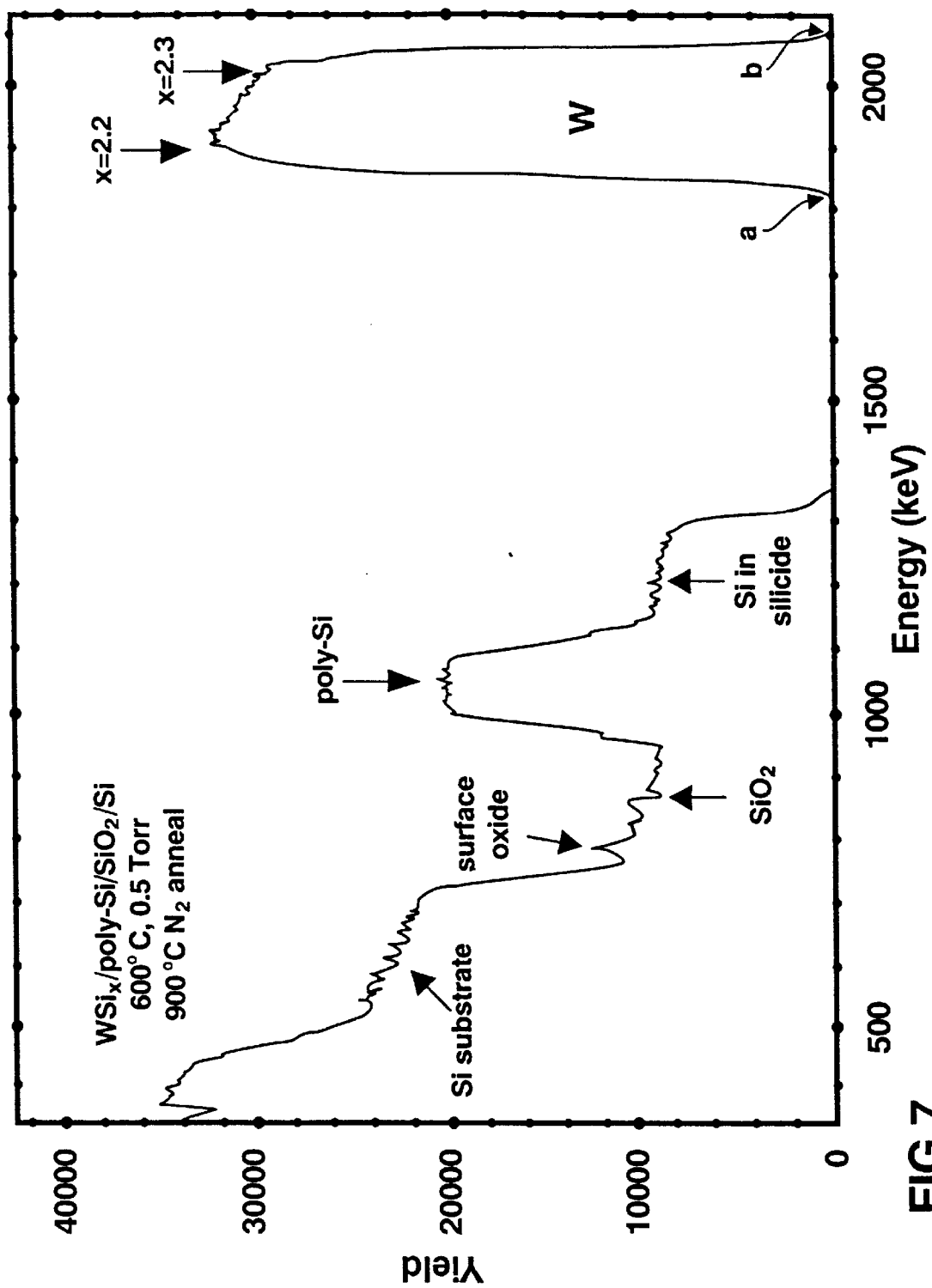
Figure 8:
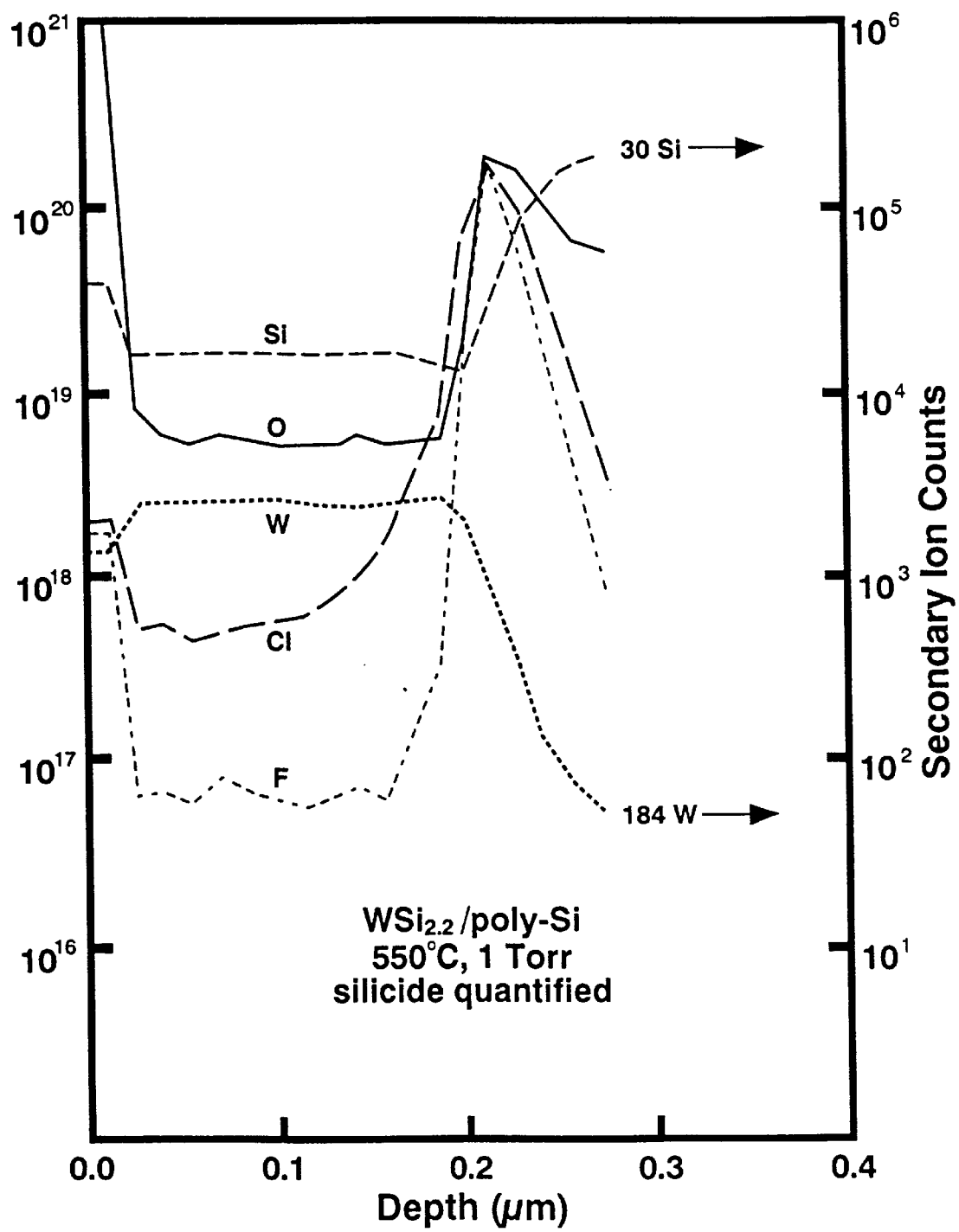

FIGS. 2 and 3 graphically present resistivity of various $WSi_x$ films, varying with depth into the film;

FIGS. 4 and 5 present RBS spectrum of a $WSi_x$ film with an unsatisfactory Si:W ratio in the interfacial region of the film, before and after annealing, respectively;

FIGS. 6 and 7 present RBS spectrum of a satisfactory $WSi_x$ film produced by a process according to the present invention, before and after annealing, respectively; and FIG. 8 presents a SIMS spectrum for a $WSi_x$ film produced by a process according to the present invention, showing the low fluorine impurity content in the film.

DESCRIPTION

The present invention is directed to $WSi_x$ films with a value of x that is substantially uniform through the thickness of the film, and which contain less than $10^{18}$ fluorine atoms/cc, and more preferably less than $10^{17}$ fluorine atoms/cc. By "substantially uniform" it is meant that the average value of x within each strata of the $WSi_x$ layer is between ±10% of the average bulk value of x through the thickness of the $WSi_x$ layer. Typically, the bulk value of x is from about 2.0 to about 2.8, and preferably the value of x is from about 2.2 to about 2.6. The substantially uniform $WSi_x$ film is deposited on substrates using chemical vapor deposition processes.

Substrates

The $WSi_x$ film can be deposited on a wide variety of substrates including glasses, plastics, metals, and semiconducting wafers comprising silicon, silicon oxide, polysilicon and gallium arsenide. Moreover, the $WSi_x$ layer can be deposited on top of other layers such as a layer of $Si_3N_4$, polysilicon, thermally oxidized $SiO_2$, or a combination of these layers. Also, additional layers can be deposited on the $WSi_x$ film.

Deposition Chamber

The chemical vapor deposition chamber used to deposit the substantially uniform $WSi_x$ film is preferably conventional low pressure CVD equipment such as those sold by Applied Materials of Santa Clara, Calif., and described in T. E. Clark, et. al., *Tungsten And Other Advanced Metals for VLSI/ULSI Applications V*, Edited by S. S. Wong and S. Furukawa, (Mat. Res. Soc. Proc., Pittsburgh, Pa. 1990) page 167.

With reference to FIG. 1a, an apparatus 10 suitable for preparing films according to the present invention comprises a deposition chamber 12, an exhaust system 14, and a gas combining or mixing assembly 16. A substrate 20, such as a silicon based semiconductor wafer, horizontally rests on top of a support or susceptor 24. A heater 26 lies directly beneath the support 24 and is used to heat the substrate 20. A deposition or reaction zone 28 lies directly above the substrate 20.

The process gases used in the CVD process enter the deposition chamber 12 through gas inlets 30, which lead into a "showerhead" type diffuser 32. The diffuser 32 uniformly distributes the process gas in the deposition zone 28. A gas combining or mixing assembly 16 can be used to mix or combine the deposition gases upstream of the showerhead 32, so that the deposition gases are substantially uniformly mixed when introduced into the deposition zone 28.

The exhaust system 14 is connected to the chamber 12 through an exhaust line 40. The exhaust system 14 typically comprises a rotary vane vacuum pump (not shown) capable of achieving a minimum vacuum of about 10 mTorr, and optionally can include scrubber systems for scrubbing by-product gases. The pressure in the chamber 12 is sensed at the side of the substrate 20, and is controlled by adjusting a throttle valve 42 in the exhaust line 40.

Process Gases

Preferably, the process gas comprises a deposition gas such as (i) a silicon source gas, such as dichlorosilane (DCS), and (ii) a tungsten source gas, such as tungsten hexa-fluoride ($WF_6$). Although dichlorosilane and tungsten hexa-fluoride are used to illustrate the invention, any silicon or tungsten source gas, or combination of gases, known to those skilled in the art can also be used. Thus the scope of the inventions described herein should not be limited to use of DCS or $WF_6$.

A seeding or nucleation gas such as $SiH_4$ or $H_2$, can be added to the process gas to initiate deposition of a uniform layer of $WSi_x$ on the substrate. The process gas can also contain a carrier gas, such as argon or helium.

The $WF_6$ and the DCS are transported through the feedlines 50 and 52, respectively. Mass flow controllers 54a and 54b and air operated valves 56 are used to control the flow of the reactant gases into the deposition chamber 12. The flow rates of the DCS and $WF_6$ affect the rate at which $WSi_x$ film is deposited. A film deposition rate of at least 100Å per minute provides a commercially feasible production rate. Preferably, a film deposition rate above about 500Å is obtained.

The volumetric flow ratio of DCS to $WF_6$ also determine the value of x in the deposited $WSi_x$ film. As the DCS to $WF_6$ ratio increases, the amount of silicon in the $WSi_x$ layer, i.e., the value of x increases. The desired value of x (from about 2.0 to about 2.8), and the desired deposition rates can be achieved by introducing DCS into the chamber at a volumetric flow rate from about 100 to about 1000 sccm, and tungsten hexa-fluoride at a volumetric flow rate of from about 2.5 to about 20 sccm. Generally, the flow ratio of DCS to $WF_6$ is from about 5:1 to about 400:1. Optionally, argon can be added to the gas flow at a rate of from about 100 to about 1000 sccm.

Pre-Mixing

Figure 1C:
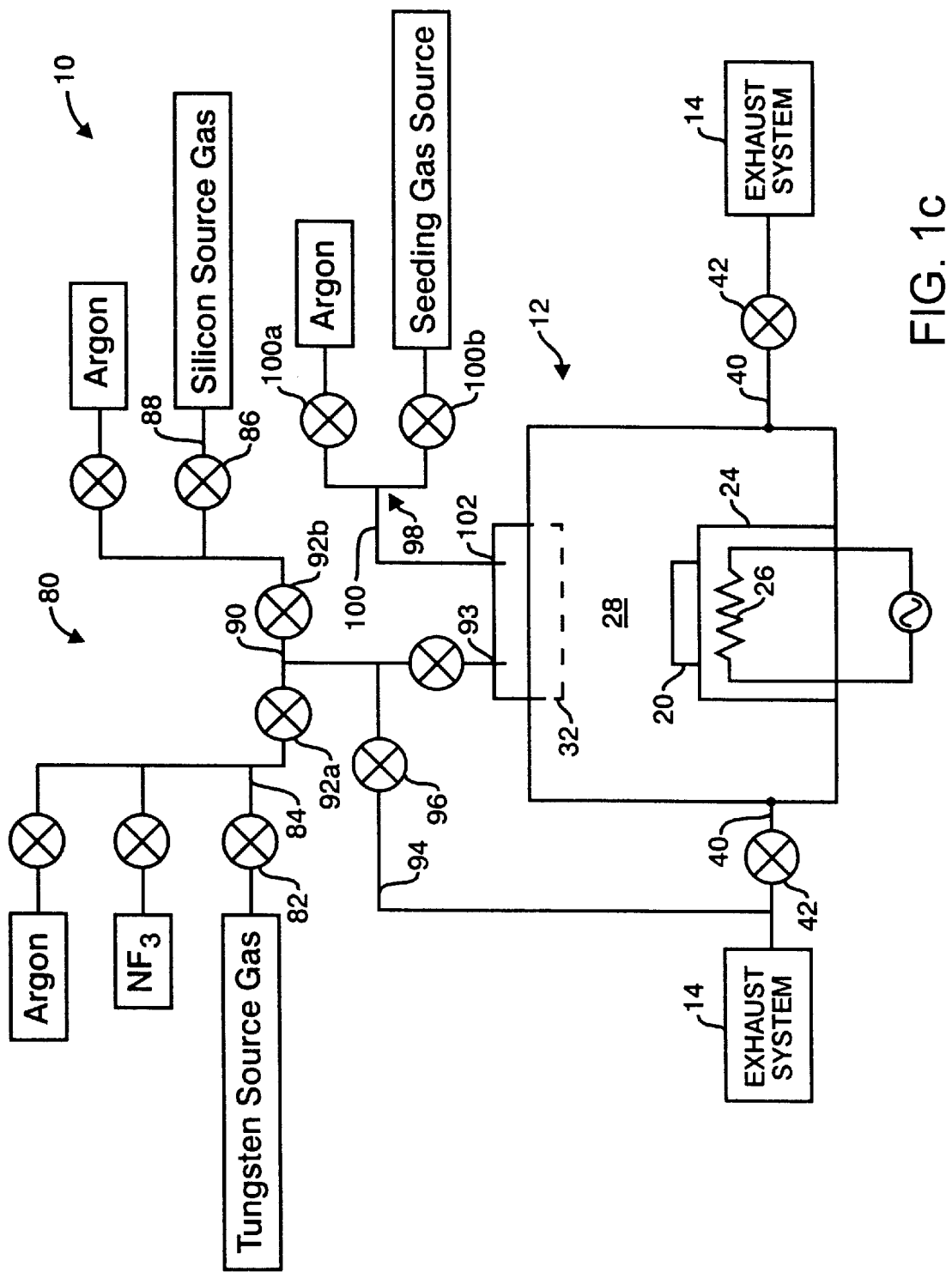
FIG. 1c is a schematic view of another chemical vapor deposition apparatus suitable for preparing the $WSi_x$ films of the present invention.

It is preferred to pre-mix or combine the dichlorosilane and tungsten hexa-fluoride upstream of the deposition zone 28 as shown in FIGS. 1a and 1c. Combining the gases in a gas feedline upstream of the deposition chamber 12 results in a more uniform gas mixture being introduced into the deposition zone 28. By "upstream" it is meant before, and at a distance from, the deposition chamber 12. Preferably, the gases are combined in a feedline which is at least 2.5 inches (6.35 cms) upstream of the deposition chamber 12. It is believed that upstream pre-mixing produces a substantially more uniform initial gas mixture, thereby resulting in greater uniformity in the tungsten to silicon ratio in the "interfacial" layer of $WSi_x$ film that is first deposited on the substrate.

A preferred method for combining the DCS and $WF_6$ upstream of the deposition zone 28 utilizes a mixing/non-mixing/diverting assembly 16, as shown in FIG. 1a. The assembly 16 allows switching between a gas mixing mode, a gas non-mixing mode, and a diverting mode. In the mixing mode, the apparatus 10 can be used for processes where the process gases are mixed. In the non-mixing mode, the apparatus 10 can be used for processes where the process gases are not mixed. The assembly 16 also allows diverting of residual or contaminant process gases directly to the exhaust system 14 in the diverting mode.

With reference to FIG. 1a, the assembly 16 comprises: (i) a valve 62 in the $WF_6$ feedline 50, (ii) a valve 63 in the DCS feedline 52; (iii) a first transfer line 64 with a pair of valves 66 therein, the line 64 connecting the $WF_6$ feedline 50 to the DCS feedline 52; (iv) a second transfer line 70 with a pair of valves 72 therein, the line 70 also connecting the $WF_6$ feedline 50 to the DCS feedline 52; and (v) a mixing/diverting line 74 with a valve 76 therein, the line 74 connecting the first transfer line 64, the second transfer line 70, and the exhaust line 40.

In order to mix or combine the process gases prior to their introduction into the deposition chamber 12, the valves 62, 63, and 76 are "closed," and both of the valves 66 as well as both of the valves 72 are "opened." This causes the $WF_6$ and DCS gases to be directed along arrows 84, thereby causing the WF6 to mix with the DCS in line 74. The pre-mixed process gases then re-enter the lines 50 and 52 through the open valves 72a and 72b, and are introduced into the deposition chamber 12 through the gas inlets 30.

In the non-mixing mode, both of the valves 66 and both of the valves 72 are closed, and the valves 62 and 63 are opened. This causes the $WF_6$ and DCS, to separately flow along the pipelines 50 and 52, respectively.

In the diverting mode, both of the valves 66 and the valve 76 are opened, and the valves 62, 63 and both of the valves 72 are closed. This causes the process gases to be diverted directly to the exhaust line 40 through the diverting line 74. The diverting mode is used at the beginning of the process to divert residual process gases which remain in the feedlines 50 and 52, in order to stabilize the composition of the process gases in the feedlines 50 and 52, before pre-mixing and introducing the process gases into the deposition chamber 12.

Another version of the assembly 16 is shown in FIG. 1b. This version does not have a diverting line and has fewer valves. To mix the gases, the valves 62 and 72 are closed, and the valve 66 is opened. This causes the $WF_6$ gas to be redirected into line 50, where the gas mixes with the DCS before being introduced into the deposition chamber 12.

Instead of using the assembly 16, it is also possible to combine the gases, by merging the pipelines 50 and 52 into a single pipeline upstream of the deposition chamber 12. Alternatively, it is also possible to mix the process gas in a mixing container.

Seeding Gas Process

A "seeding" or nucleation gas can be used to initiate deposition of an uniform interfacial $WSi_x$ layer on the substrate. In this process, a seeding gas such as monosilane, disilane, trisilane or $H_2$ is added to the process gas during the initial deposition stages for initiating deposition of an interfacial layer having a uniform Si:W ratio. The seeding gas process is advantageous because it allows deposition of a tungsten silicide film having a uniform sheet resistance, even for sheet resistivities greater than 1000 $\mu\Omega$-cm. In tested examples, the variation in sheet resistance of tungsten silicide films deposited using a silane seeding gas was lower than that obtained from prior art methods, the non-uniformity in sheet resistance typically ranging from about 0.9 to about 2%.

Preferably, the seeding gas is introduced into the deposition chamber via a separate gas inlet than the gas inlet used to introduce the deposition gas. This prevents the seeding gas and deposition gases from reacting to form contaminant particulates in the gas feedlines, via gas phase nucleation mechanisms. In this process, because the deposition gas is premixed, the silicon and tungsten source deposition gases are selected so that when the gases are mixed, substantially no gas phase nucleation occurs in the mixture of gases. Suitable deposition source gases for mixing at room temperature include dichlorosilane and $WF_6$.

A preferred mixing apparatus 10 allowing separate introduction of the seeding gas and the premixed deposition gas, is shown in FIG. 1c. In this apparatus 10, the silicon source gas and the tungsten source gas are combined upstream from the deposition zone 28 using a deposition gas mixing/diverting assembly 80, also known as a mixing manifold.

The mixing assembly 80 combines the silicon source gas and the tungsten source gas at least 2.5 inches upstream of the deposition chamber 12. The mixing assembly 80 also allows switching between a deposition gas mixing mode, a cleaning gas mode, and a diverting mode. In the mixing mode, the apparatus 10 is used for deposition processes where the deposition gases are mixed prior to introduction into the chamber 12. In the cleaning gas mode, cleaning gas, such as $NF_3$ is introduced into the apparatus 10 to clean the apparatus. The diverting mode allows diverting of residual or contaminant process gases directly to the exhaust system 14.

With reference to FIG. 1c, the assembly 80 comprises: (i) a valve 82 in the tungsten source gas ($WF_6$) feedline 84, (ii) a valve 86 in the silicon source gas (DCS) feedline 88; (iii) a first transfer line 90 with a pair of valves 92a, 92b, connecting the $WF_6$ feedline and the DCS feedline to the first gas inlet 93 in the chamber 12; and (iv) a mixing/diverting line 94 with a valve 96 therein, connecting the first transfer line 90 to the exhaust line 40. Typically, the mixing assembly 80 is maintained at room temperature; however, the mixing assembly can also be maintained at a temperature at which substantially no gas phase nucleation occurs during mixing of the deposition gases, using conventional cooling means such as a refrigeration unit, or conventional heating means such as electrical heating tape wrapped around the feedlines.

A separate seeding gas assembly 98 allows separate introduction of the seeding gas into the chamber 12. A second feedline 100 with a pair of valves 100a, 100b therein, connects a seeding gas source and an argon source to a second gas inlet 102 of the deposition chamber 12. Applicant has discovered that separate introduction of the deposition and seeding gases prevents gas phase nucleation of the gases in the feedlines, which can form contaminant particulates which are difficult to clean.

To perform the two-stage seeding gas process, a substrate 20 is transferred to the deposition chamber 12, and heated to the process temperature. Thereafter, the chamber 12 is alternately purged and pumped down using argon gas at a flow rate of about 300 sccm for at least about 20 seconds. Thereafter, to obtain a uniform mixture of deposition gases in the mixing assembly 80, initially the valve 93 is "closed" and the diverting valve 96 is "open" causing residual $WF_6$ and DCS gases to be diverted to the exhaust 14 until the gases are uniform in composition. The diverting mode is used at the beginning of the process to divert residual process gases which remain in the feedlines, in order to stabilize the composition of the process gases in the feedlines, before introducing the pre-mixed process gases into the deposition chamber 12. Thereafter, the valve 96 is shut and valve 93 is opened to allow the uniformly mixed deposition gases to flow through the first inlet 93. Typically, the mixed deposition gases are diverted for about 2 to 10 seconds, more typically for 3 to 7 seconds, and most typically about 5 seconds.

In the initial deposition stage of this process, the premixed deposition gases are introduced into the deposition chamber 12 through the first gas inlet 93. Typically, the DCS is flowed at a volumetric flow rate from about 100 to about 1000 sccm, and the $WF_6$ is flowed at a volumetric flow rate of from about 1 to about 20 sccm. When DCS and $WF_6$ are used, the flow ratio of DCS to $WF_6$ is typically from about 5:1 to about 400:1. Optionally, argon can be added to the gas flow at a rate of from about 100 to about 1000 sccm.

During the initial deposition stage, the seeding gas is separately introduced into the deposition chamber through the second gas inlet 102. The seeding gas is typically flowed at a rate of about 10 to about 500 sccm, and is preferably flowed at a rate of about 100 to about 400 sccm, for a period sufficiently long that the total volume of seeding gas introduced into the deposition chamber ranges from about 1 scc to about 125 scc. Typically, the seeding gas is introduced for a period ranging from about 1 to about 60 seconds, and more preferably from about 2 to about 30 seconds. Most preferably, the seeding gas is introduced in the deposition chamber 12 for less than about 20 seconds, or less than about 10 seconds.

Further, in the initial stages, the deposition chamber 12 is maintained at process conditions suitable for depositing a $WSi_x$ interfacial layer with a uniform Si:W ratio on the substrate, suitable temperatures being described below. During introduction of the seeding gas, the pressure in the chamber is preferably maintained at about 1 to 10 Torr, more preferably from 1 to 5 Torr, and most preferably about 3 Torr.

In the second stage of the process, the flow of seeding gas is shut off, and only dichlorosilane and tungsten hexafluoride are flowed into the deposition chamber, at the same flow rates or flow ratios described above. In this stage, the deposition chamber 12 is maintained at process conditions suitable for depositing a substantially uniform, substantially fluorine-free, $WSi_x$ layer on the substrate, suitable temperatures and pressures being described below.

Temperature The higher the temperature in the deposition zone 28, the higher the deposition rate on the substrate 20. The minimum support 24 temperature allowing commercially feasible deposition rates on the substrate 20 is about 430° C. Lower support temperatures result in rates that are too slow for commercially feasible products. The maximum temperature is determined by the maximum use temperature of the CVD equipment. It has been discovered that support temperatures in excess of about 450° C. are preferred, temperatures between about 500° C. and about 700° C. more preferred, and temperatures of about 550 to 625° C. most preferred.

The temperature of the substrate 20 referred to herein is the temperature of the support 24, which is measured with a thermocouple, since it is impractical to measure the temperature of the substrate 20 itself. Accordingly, all temperatures referred to herein are temperatures at which the support 24 is maintained. Typically, the temperature of the support 24 is about 20° C. to about 100° C. higher than the temperature of the substrate 20. For example, when the support is maintained at a temperature of 500° C., the substrate 20 is at a temperature of about 480 to 490° C.

The deposition chamber 12 can be heated using the radiation heating lamps 26 beneath the support 24. Other conventional heating apparatus can be used.

Pressure

The pressure in the deposition chamber 12 is maintained at at least 0.5 Torr and preferably from about 1 Torr to about 20 Torr. If the pressure is over 20 Torr, delamination between the $WSi_x$ film and the underlying substrate can occur. If the pressure is less than about 0.5 Torr, the same deficiencies as those observed in the prior art films, namely a non-uniform interface between the $WSi_x$ film and the substrate 20, is observed.

A multiple-stage pressure process, typically a two-stage pressure process, or a single-stage pressure process can be used. These processes are described below.

Two-Stage Process

When the deposition chamber 12 contains impurities, such as residual silicon containing deposits, it is preferred to use a two-stage process. The two-stage process comprises a high pressure first stage, followed by a low pressure second stage. It is believed that by operating initially at a higher pressure, the tendency of contamination to cause deposition of $WSi_x$ strata with a silicon to tungsten ratio lower than desired is overcome. The process is not limited to use of two distinct pressures, but rather, multiple pressures can be used.

In the two-stage process, the first higher pressure is at least 1 Torr, to compensate for effects that tend to lower the Si/W ratio, and the second lower pressure is at least 0.5 Torr less than the first higher pressure, i.e., for a first higher pressure of 1 Torr, the lower second pressure would be less than 0.5 Torr. Similarly, if the first higher pressure is about 2 Torr, the second pressure would be less than about 1.5 Torr.

Generally, the first stage can last from about 10 seconds to about two minutes, and the second stage from about 30 seconds to about 5 minutes. The change in pressure from the first higher pressure to the second lower pressure occurs over a finite period of time, i.e., the change of pressure is not a step change.

The composition of the process gas can be changed during the deposition process. As the pressure is reduced, the reaction efficiency of DCS decreases. This can require the flow ratio of DCS to $WF_6$ to be increased. For example, when the first stage process is 10 Torr, the flow ratio of DCS to $WF_6$ would be about 25:1, and when the pressure is reduced to 1 Torr for the second stage, the ratio is about 37.5:1. However, it is not always necessary to change the flow ratio.

Preferably the temperature in the deposition chamber 12 is maintained substantially the same during both stages, and preferably, in the two-stage process, the support 24 is heated to a temperature of about 550° C.

Single-Stage Process

Rather than varying the pressure, it is also possible to obtain a substantially uniform $WSi_x$ layer by starting off with a cleaned and conditioned deposition chamber 12, and depositing the $WSi_x$ layer in a single-stage high pressure process, in which the chamber 12 is maintained at a pressure of at least about 0.5 Torr, preferably at least about 1 Torr, and most preferably from about 1 Torr to about 20 Torr, and the support 24 maintained at a temperature of at least about 550° C.

To clean the chamber 12, $NF_3$ gas is introduced into the chamber 12, and a plasma generated. The plasma activated $NF_3$ reacts with silicon containing deposits in the chamber 12, such as deposits on the wall, to form gaseous silicon-fluoride compounds. The silicon-fluoride compounds are removed from the chamber 12, thereby substantially cleansing the chamber 12 of silicon containing compounds. The plasma can be generated with RF energy and maintained at a power level of about 30 to 300 Watts, for about 10 to about 40 seconds per wafer processed in the chamber, to achieve adequate vaporization of the silicon containing compounds.

Any residual fluorine ions in the chamber 12 can be removed by passivating the fluorine ions with a reactive hydrogen containing gas such as hydrogen. Residual fluorine can be passivated by generating a plasma in the chamber which causes hydrogen ions from the reactive hydrogen containing gas, to react with substantially all of the unreacted residual fluorine atoms. Alternatively, monosilane can also be used to passivate the residual fluorine.

In the single-stage process, the first wafer produced immediately after the deposition zone 28 in the chamber 12 is conditioned, is usually unsatisfactory. The next twenty-five wafers produced are satisfactory. After processing of about twenty-five wafers, it is believed that the chamber 12 should be re-conditioned.

EXAMPLES

The following examples demonstrate the effectiveness of processes according to the present invention. In these examples, a single-wafer process chamber, namely a "Precision 5000" low pressure CVD equipment as sold by Applied Materials, Santa Clara, Calif., and described in Clark, et al., supra, was used to deposit $WSi_x$ layer on a silicon wafer with a thermal oxide layer. The silicon wafer had a thickness of about 0.73 mm and a diameter of either about 150 or about 200 mm, and was loaded using a mechanical arm into the deposition chamber 12 from a load lock area (not shown) maintained at a pressure of 7 Torr of nitrogen.

The wafer 20 was introduced into the deposition chamber 12 at room temperature, and placed on a radiatively heated support 24. The wafer 20 typically equilibrated within 60 seconds and was at a temperature of about 20 to 100° C. lower than the support 24 temperature. When the wafer 20 achieved equilibrium temperature, the pressure in chamber 12 was established using a flow of non-reactive gases through pipelines 50 and 52, and the pressure controlled by the throttle valve 42 on the exhaust line 40. Process gases which include DCS and $WF_6$, were then introduced into the chamber 12 at the required flow rate through the showerhead diffuser 32.

Annealing

After the $WSi_x$ layer was deposited, in some tests, the wafer was then annealed in flowing nitrogen at 900° C. for 30 minutes.

Characterization Procedure

The following techniques were used to characterize the $WSi_x$ films:

(1) The compositional variation of the tungsten to silicon ratio through the thickness of the deposited $WSi_x$ film was determined by Rutherford Backscatting Spectrometry (RBS) using a 2.275 Mev helium ion beam.

(2) The presence of impurities such as chlorine, fluorine, oxygen and carbon in the deposited film was detected by secondary ion mass spectrometry (SIMS), in a Cameca IMS4F system using a 14.5 KeV cesium ion beam. Ion implanted standards with known quantities of impurities were used to quantify the impurity levels in the SIMS profiles.

(3) The resistivity of the deposited film was measured on a "PROMETRIX RS-35" machine purchased from Prometrix, Santa Clara, Calif.

Examples 1–4

Multiple Stage Process

Examples 1–4 demonstrate that a two-stage pressure process, with a first higher pressure and a second lower pressure, produces substantially uniform $WSi_x$ films with a Si:W ratio in the interfacial region of the film in the optimal range of 2.0 to 2.8.

Table I identifies the process conditions used at each stage of the two-stage processes of Examples 1–4. Examples 1–3 provided satisfactory films and Example 4 provided an unsatisfactory film. In all the examples, a silicon wafer with a thermal oxide layer was used for the substrate 20, and the gap between the showerhead 32 and the wafer 20 was set at 0.45 inches. Examples 1 and 2 used a 150 mm diameter wafer, and Examples 3 and 4 used a 200 mm wafer.

The films of Examples 1 and 2, were processed using first higher pressures of 3 Torr and 5 Torr, respectively. FIG. 2 presents the linear resistivities of these films varying with depth into the film. For comparison purposes, FIG. 2 also presents the linear resistivity of a baseline film prepared by a single pressure process of 1.5 Torr and 550° C. for 80 seconds, using a $WF_6$ flow of 3.5 sccm, a DCS flow of 150 sccm, and an Argon flow of 500 sccm. It is seen from FIG. 2 that as the initial or first higher pressure increases from 1.5 Torr (in the single pressure baseline process) to 3 Torr (Example 1) and 5 Torr (Example 2), the resistivity of the interfacial regions of the films increases from about 400 $\mu\Omega$-cm to about 1000 $\mu\Omega$-cm. The higher resistivity indicates that the Si:W ratio in the interface is in the optimal range of from about 2.2:1 to about 2.6:1. Thus, a two-stage process with a first higher pressure and a second lower pressure, produces a $WSi_x$ film with a desirable Si:W ratio.

The linear resistivity of the film of Example 3 is presented in FIG. 3. For comparison purposes, the resistivity of a baseline film prepared by a single pressure process of 1 Torr and 550° C. for 80 seconds, using a $WF_6$ flow of 3.5 sccm, a DCS flow of 150 sccm, and an Argon flow of 500 sccm, is also presented in FIG. 3. The film of Example 3, processed at a first higher pressure of 3 Torr, shows a resistivity of 1100 $\mu\Omega$n-cm at the interfacial region, indicating that the Si:W ratio in the interface is above 2.0. In contrast the resistivity of the baseline film at 400 $\mu\Omega$-cm indicates an undesirable Si:W ratio at the interface, which was determined by RBS spectroscopy to be about 1.8.

The film of Example 4 provided unsatisfactory results indicating that a two-stage process with a first higher pressure of 10 Torr and a second lower pressure of 1 Torr is not suitable. The Si:W ratio in the film was determined by RBS spectroscopy to be 5.4:1 in the first ⅙th of the film, 4:1 in the next ⅙th, and 2.6:1 in the last ⅔rds of the film. The high Si content in the interface was undesirable for the reasons provided above.

Examples 5–13:

Single Stage Process

Table II presents the results of experiments which used a single-stage pressure process. These experiments reveal that substantially uniform and substantially fluorine-free $WSi_x$ layers can be deposited on substrates by maintaining the chamber pressure at at least 0.5 Torr, preferably at least about 1 Torr, and by heating the support to a temperature of at least 550° C. It is preferred to clean the deposition chamber after the processing of every 25 or more wafers.

Examples 5–10 provided $WSi_x$ films having satisfactory Si:W ratios from about 2.0 to about 2.8. Comparison of the films of Example 6 and 7, and comparison of the films of Examples 8 and 9, show that increasing pressure reduces the variability of the Si:W ratio of the film. Example 6 processed at 1 Torr shows a Si:W ratio of 2.41 to 2.48, while Example 7 processed at a lower pressure of 0.5 Torr shows a larger Si:W ratio variation of 2.2 to 2.55. Similarly, Example 9 run at a higher pressure of 1 Torr shows a lower Si:W ratio variation than Example 8 which was run at the lower pressure of 0.5 Torr.

TABLE I

|  | EXAMPLE 1 | | EXAMPLE 2 | | EXAMPLE 3 | | EXAMPLE 4 | |
| --- | --- | --- | --- | --- | --- | --- | --- | --- |
|  | FIRST STAGE | SECOND STAGE | FIRST STAGE | SECOND STAGE | FIRST STAGE | SECOND STAGE | FIRST STAGE | SECOND STAGE |
| TIME (seconds) | 20 | 60 | 20 | 60 | 20 | 60 | 30 | 90 |
| PRESSURE (Torr) | 3.0 | 1.5 | 5.0 | 1.5 | 3.0 | 1.0 | 10 | 1.0 |
| $WF_6$ (sccm) | 3.5 | 3.5 | 3.5 | 3.5 | 3.5 | 3.5 | 3 | 3 |
| DCS FLOW (sccm) | 150 | 150 | 150 | 150 | 150 | 150 | 200 | 200 |
| ARGON (sccm) | 500 | 500 | 500 | 500 | 500 | 500 | 500 | 500 |
| TEMPERATURE (° C.) | 550 | 550 | 550 | 550 | 550 | 550 | 510 | 510 |

TABLE II

| Example No. | 5 | 6 | 7 | 8 | 9 | 10 | 11 | 12 | 13 |
| --- | --- | --- | --- | --- | --- | --- | --- | --- | --- |
| Support Temperature (° C.) | 550 | 600 | 600 | 600 | 550 | 550 | 510 | 510 | 510 |
| Pressure (Torr) | 1 | 0.5 | 1 | 0.5 | 1 | 0.5 | 1 | 10 | 10 |
| DCS (sccm) | 150 | 150 | 150 | 150 | 150 | 150 | 200 | 200 | 200 |
| $WF_6$ (sccm) | 4 | 4 | 5 | 4 | 4 | 3 | 3 | 3 | 3 |
| Film Thickness (Å) | 2250 | 1930 | 2770 | 2210 | 2600 | 1660 | — | 3180 | — |
| Annealed | yes | yes | no | no | no | no | no | no | yes |
| Si:W ratio[1] | 2.07–2.19 | 2.17–2.32 | 2.41–2.48 | 2.2–2.55 | 2.34–2.40 | 2.48–2.70 | 1.95–3.15 | 3.3–4.3 | 3.3–2.5[2] |
| Si:W ratio (average) | 2.17 | 2.27 | 2.46 | 2.4 | 2.36 | 2.59 | — | — | — |

[1]First number represents value for ⅓ of layer closest to the interface, and the second number represents value for remainder of the layer (except for Example 13 as noted below).
[2]Three different regions were present with the first ⅙ being at 3.3, a transition ⅙ at 4.7, and the remaining ⅔ at 2.5.

Examples 11–13 provide results of unsatisfactory experiments run at temperatures of about 510° C. Examples 11 and 12 show that non-uniform Si:W ratios are obtained for films deposited at 510° C./1 Torr and 510° C./10 Torr, respectively. Example 12 shows that a pressure of 10 Torr increases the value of x above the desirable range of 2.0 to 2.8. Example 13 shows the adverse effect of annealing Example 12. It is believed that the annealing step in Example 13 causes Si migration resulting in a non-uniform $WSi_x$ film.

FIGS. 4 and 5 show that annealing of an unsatisfactory $WSi_x$ film which has a Si:W ratio below 2.0 in the interfacial strata, results in migration of silicon to the interface during the annealing process. The silicon migration is undesirable because it can result in the film delaminating from the substrate. The 2000 KeV peak in FIG. 4 shows that the interfacial region of the $WSi_x$ film has a Si:W ratio of about 1.5, i.e., below the desirable range of 2.0 to 2.8. FIG. 5 shows the RBS spectra of the same film, after the film was annealed in nitrogen at 900° C. for 30 minutes. The 2000 KeV peak of FIG. 5 shows that the value of x in the interface increased to about 3.3, indicating that silicon migrated to the interface during the annealing step. It is believed that this high silicon ratio at the interface causes delamination of the film.

FIGS. 6 and 7 show that $WSi_x$ films with interfacial Si:W ratios from about 2.0 to about 2.6, do not result in migration of silicon during annealing. The 2000 KeV peak in FIG. 6, shows that the interfacial $WSi_x$ layer has a value of x of about 2.5. FIG. 7 shows an RBS spectrum of the film of FIG. 6, after the film was annealed in nitrogen at 900° C. for 30 minutes. With reference to the peak between the points a and b in FIG. 7, the Si:W ratio at the interface of the $WSi_x$ film is about 2.2, and in the bulk of the film is about 2.3, indicating that silicon did not migrate to the interfacial region during annealing. Also, the value of x in the bulk of the film changes only about 0.1 from the value of x in the interface, indicating that the variability of x between the interfacial strata of the film and the bulk of the film is only about +5%. Such a variability is preferred and does not cause delamination of the $WSi_x$ layer.

FIG. 8 shows that a $WSi_x$ film produced by a process of the present invention has an average fluorine content of about $7 \times 10^{16}$ atoms/cc, i.e., less than about $10^{17}$ atoms/cc. The average bulk value of x in this film was determined by RBS spectra to be about 2.5. This illustrates the low fluorine impurity content of the $WSi_x$ films of the present invention.

Example 14

Upstream Mixing

A uniform tungsten silicide film was deposited on the wafer 20 using the following process conditions. The pressure was maintained at 5 Torr, and the temperature of the substrate 20 maintained between 450–700° C. The flow rate of $WF_6$ was 10 sccm, and the flow rate of $SiH_2Cl_2$ was 500 sccm.

The two gases were mixed in the mixing assembly 16 shown in FIG. 1b. This version of the assembly 16 did not include a diverting line. The process gases were mixed by closing the valves 62 and 72, and opening the valve 66. This caused the $WF_6$ to be redirected from feedline 50 into feedline 52, thereby combining the two gases in the feedline 52. The combined gases entered the deposition chamber 12 though a single gas inlet 30, to deposit a uniform $WSi_x$ film on the substrate.

The films and process of the present invention have significant advantages. Because of the substantially constant Si:W ratios through the thickness of the films, and because of their low fluorine content, the films do not tend to delaminate from the underlying substrate. Thus, it is expected that fewer defective integrated circuits will be built, and the cost of integrated circuits will be lowered. Moreover, the films can be deposited using existing conventional equipment. Therefore, investments in expensive chemical vapor deposition equipment are not required.

Although the present invention has been described in considerable detail with regard to the preferred versions thereof, other versions are possible. For example, although a particular mixing gas assembly is shown, the apparatus can comprise other conventional mixing gas assemblies. Also, the process of pre-mixing the process gas upstream of the deposition chamber can be used with other CVD processes than those illustrated herein. Therefore, the appended claims should not be limited to the descriptions of the preferred versions contained herein.

What is claimed:

1. A chemical vapor deposition process for depositing $WSi_x$ on a substrate, the process comprising the steps of:
    (a) placing a substrate in a deposition chamber having first and second gas inlets;
    (b) forming a mixed deposition gas by combining silicon source gas and tungsten source gas sufficiently upstream of the deposition chamber that the mixed deposition gas is substantially uniformly mixed prior to introduction into the deposition chamber;
    (c) during an initial deposition stage, introducing the mixed deposition gas into the deposition chamber through the first gas inlet, separately introducing a seeding gas into the deposition chamber through the second gas inlet, and maintaining the deposition chamber at process conditions suitable for depositing an interfacial layer on the substrate; and
    (d) during a second deposition stage, stopping flow of seeding gas while continuing to introduce the mixed deposition gas into the deposition chamber, and maintaining the deposition chamber at process conditions suitable for depositing a $WSi_x$ layer on the substrate.

2. The process of claim 1, wherein in step (b) the silicon source gas and the tungsten source gas are combined at least 2.5 inches upstream of the deposition chamber.

3. The process of claim 1, wherein in step (b) the silicon source gas and the tungsten source gas are selected so that substantially no gas phase nucleation of the gases occurs when the gases are mixed.

4. The process of claim 1, wherein step (b) further comprises the step of maintaining the mixed deposition gases at a temperature at which substantially no gas phase nucleation occurs in the mixed deposition gas.

5. The process of claim 1, wherein the silicon source gas comprises dichlorosilane and the tungsten source gas comprises $WF_6$.

6. The process of claim 5, wherein during both stages of the process, the volumetric flow ratio of dichlorosilane to $WF_6$ is from about 5:1 to about 400:1.

7. The process of claim 1 wherein the seeding gas is selected from the group consisting of monosilane, disilane, trisilane and $H_2$.

8. The process of claim 1 wherein the initial deposition stage is performed for only a sufficient period to initiate deposition of an interfacial layer comprising $WSi_x$ having a substantially uniform Si:W ratio.

9. The process of claim 1 wherein in step (c), the seeding gas is introduced in the deposition chamber for less than about 20 seconds.

10. The process of claim 9 wherein in step (c), the seeding gas is introduced in the deposition chamber for less than about 10 seconds.

11. The process of claim 1 wherein during both stages of the process, the substrate is heated to a temperature of at least about 450° C.

12. The process of claim 1 wherein in step (c) the volumetric flow rate of the seeding gas ranges from about 10 to about 500 sccm.

13. The process of claim 1 wherein in step (c) the total volume of seeding gas introduced into the deposition chamber during the initial deposition stage ranges from about 1 to about 125 scc.

14. A process for depositing a $WSi_x$ layer on a substrate, the process comprising the steps:
  (a) placing a substrate within a deposition zone;
  (b) during an initial stage, introducing a first process gas consisting of seeding gas into the deposition zone, and maintaining the deposition zone at process conditions suitable for depositing an interfacial layer on the substrate, the interfacial layer capable of serving as a seeding layer; and
  (c) during at least one subsequent stage, flowing a second process gas comprising silicon source gas and tungsten source gas into the deposition zone, and maintaining the deposition zone at process conditions suitable for depositing a $WSi_x$ layer on the interfacial layer.

15. The process of claim 14, wherein in step (b), the seeding gas consists of a silicon source gas.

16. The process of claim 14, wherein in step (b), the seeding gas is selected from the group consisting of monosilane, disilane, trisilane, dichlorosilane, and $H_2$.

17. The process of claim 14, wherein the substantially uniform $WSi_x$ layer on the substrate is characterized by: (i) is at least 300 Å thick, (ii) contains less than $10^{18}$ fluorine atoms/cc, (iii) comprises an average value of x within each strata of the $WSi_x$ layer that is between ±10% of the average bulk value of x through the thickness of the $WSi_x$ layer, and (iv) comprises a value of x of from about 2.0 to 2.8.

18. The process of claim 14, wherein in step (c) the silicon source gas and the tungsten source gas are combined at least 2.5 inches upstream of the deposition chamber.

19. The process of claim 14, wherein in step (c) the silicon source gas comprises dichlorosilane and the tungsten source gas comprises $WF_6$.

20. The process of claim 19, wherein in step (c) the volumetric flow ratio of dichlorosilane to $WF_6$ is from about 5:1 to about 400:1.

21. The process of claim 14 wherein the seeding gas consists of monosilane.

22. The process of claim 14 wherein in step (b) the seeding gas is introduced into the deposition zone only at the onset of the process and for a sufficient period to deposit an interfacial $WSi_x$ layer having a substantially uniform Si:W ratio.

23. The process of claim 22 wherein the seeding gas is introduced in the deposition zone for less than about 20 seconds.

24. The process of claim 23 wherein the seeding gas is introduced in the deposition zone for less than about 10 seconds.

25. The process of claim 14 wherein in step (b) the volumetric flow rate of the seeding gas ranges from about 10 to about 500 sccm.

26. The process of claim 14 wherein in step (b) the total volume of seeding gas introduced into the deposition zone during the initial deposition stage ranges from about 1 to about 125 sccm.

27. A process for depositing a $WSi_x$ layer on a substrate, the process comprising the steps:
  (a) placing a substrate within a deposition zone;
  (b) during an initial stage, introducing a first process gas consisting of seeding gas into the deposition zone, and maintaining the deposition zone at process conditions suitable for depositing an interfacial layer on the substrate, the interfacial layer capable of serving as a seeding layer; and
  (c) during at least one subsequent stage, flowing a second process gas comprising silicon source gas and tungsten source gas into the deposition zone, and maintaining the deposition zone at process conditions suitable for depositing a $WSi_x$ layer on the interfacial layer, whereby the $WSi_x$ layer is at least 300 Å thick, contains less than $10^{18}$ fluorine atoms/cc, comprises an average value of x within each strata of the $WSi_x$ layer that is between ±10% of the average bulk value of x through the thickness of the $WSi_x$ layer, and comprises a value of x of from about 2.0 to about 2.8.

28. The process of claim 27 wherein the seeding gas comprises one or more of monosilane, disilane, trisilane, dichlorosilane, or $H_2$.

29. The process of claim 27 wherein the seeding gas consists of a silicon source gas.

30. The process of claim 27 wherein the seeding gas consists of monosilane.

31. The process of claim 27 wherein the silicon source gas and the tungsten source gas are combined at least 2.5 inches upstream of the deposition chamber.

32. The process of claim 27 wherein the silicon source gas comprises dichlorosilane and the tungsten source gas comprises $WF_6$.

33. The process of claim 32 wherein the volumetric flow ratio of dichlorosilane to $WF_6$ is from about 5:1 to about 400:1.

34. The process of claim 27 wherein the seeding gas is introduced into the deposition zone only at the onset of the process and for a sufficient period to deposit an interfacial layer comprising $WSi_x$ having a substantially uniform Si:W ratio.

35. The process of claim 27 wherein the seeding gas is introduced in the deposition zone for less than about 20 seconds.

36. A process for depositing a $WSi_x$ layer on a substrate, the process comprising the steps:
  (a) placing a substrate within a deposition zone;
  (b) during an initial stage, introducing a first process gas consisting of seeding gas into the deposition zone, and maintaining the deposition zone at process conditions suitable for depositing an interfacial layer on the substrate, the interfacial layer capable of serving as a seeding layer; and
  (c) during at least one subsequent stage, forming a second process gas by combining a silicon source gas and a tungsten source gas at least 2.5 inches upstream of the deposition chamber, flowing the second process gas into the deposition zone, and maintaining the deposition zone at process conditions suitable for depositing a $WSi_x$ layer on the interfacial layer.

37. The process of claim 36 wherein the seeding gas consists of a silicon source gas.

38. The process of claim 36 wherein the seeding gas comprises one or more of monosilane, disilane, trisilane, dichlorosilane, or $H_2$.

39. The process of claim 36 wherein the silicon source gas comprises dichlorosilane and the tungsten source gas comprises $WF_6$.

40. The process of claim 39 wherein the volumetric flow ratio of dichlorosilane to $WF_6$ is from about 5:1 to about 400:1.

41. The process of claim 36 wherein the seeding gas consists of monosilane.

42. The process of claim 36 wherein the seeding gas is introduced into the deposition zone only at the onset of the process and for a sufficient period to deposit an interfacial layer comprising $WSi_x$ having a substantially uniform Si:W ratio.

43. The process of claim 36 wherein the seeding gas is introduced in the deposition zone for less than about 20 seconds.

44. A chemical vapor deposition process for depositing $WSi_x$ on a substrate, the process comprising the steps of:
   (a) placing a substrate within a deposition zone;
   (b) forming a process gas by combining dicholorosilane and $WF_6$ in a feedline at least about 2.5 inches upstream from the deposition zone;
   (c) introducing the process gas into the deposition zone;
   (d) maintaining the pressure in the deposition zone sufficiently low and heating the substrate to a temperature sufficiently high to deposit $WSi_x$ on the substrate, wherein the process gas is combined sufficiently upstream of the deposition zone so that the process gas is substantially uniform when introduced into the deposition zone, and whereby the uniform process gas deposits a substantially uniform, substantially fluorine-free layer of $WSi_x$ on the substrate, the $WSi_x$ layer having an average value of x within each strata of the $WSi_x$ layer that is between ±10% of the average bulk value of x through the thickness of the $WSi_x$ layer, the value of x being from about 2.0 to about 2.8.

45. The process of claim 44 wherein the process gas comprises a seeding gas for initiating the deposition of $WSi_x$ onto the substrate.

46. The process of claim 44 wherein the substrate is heated to a temperature of at least about 500° C.

47. The process of claim 44, wherein the volumetric flow ratio of DCS to $WF_6$ is from about 5:1 to about 400:1.

* * * * *